(12) United States Patent
Huber

(10) Patent No.: US 7,101,149 B2
(45) Date of Patent: Sep. 5, 2006

(54) AXIAL FAN FOR COMPUTER

(75) Inventor: Magnus Huber, Pfäffikon (CH)

(73) Assignee: arctic-cooling switzerland AG, Freienbach (CH)

( * ) Notice: Subject to any disclaimer, the term of this patent is extended or adjusted under 35 U.S.C. 154(b) by 146 days.

(21) Appl. No.: 10/834,232

(22) Filed: Apr. 29, 2004

(65) Prior Publication Data
US 2004/0234374 A1    Nov. 25, 2004

(30) Foreign Application Priority Data
May 22, 2003   (DE) ............................ 203 07 981 U

(51) Int. Cl.
F04D 29/52    (2006.01)

(52) U.S. Cl. ............... 415/176; 415/208.1; 415/211.2; 415/220

(58) Field of Classification Search ............... 415/220, 415/208.1, 211.2, 176, 183
See application file for complete search history.

(56) References Cited

U.S. PATENT DOCUMENTS

| | | | | |
|---|---|---|---|---|
| 4,729,714 A * | 3/1988 | Wrobel | ...................... | 415/119 |
| 5,299,632 A | 4/1994 | Lee | | |
| 5,419,780 A * | 5/1995 | Suski | ........................ | 136/205 |
| 5,421,402 A | 6/1995 | Lin | | |
| 6,129,528 A * | 10/2000 | Bradbury et al. | ......... | 417/423.1 |
| 6,236,569 B1 * | 5/2001 | McEuen | .................... | 361/719 |
| 6,322,042 B1 | 11/2001 | Nemec | | |
| 6,434,002 B1 * | 8/2002 | Wei | ............................. | 361/697 |
| 2002/0067595 A1 * | 6/2002 | Ogawa | ........................ | 361/687 |
| 2003/0017049 A1 | 1/2003 | Yang | .......................... | 415/229 |
| 2003/0091435 A1 * | 5/2003 | Horng et al. | ............. | 415/211.2 |

FOREIGN PATENT DOCUMENTS

| | | |
|---|---|---|
| DE | 93 02 754 | 5/1993 |
| DE | 298 19 423 | 11/1999 |
| DE | 201 10 299 | 10/2001 |
| DE | 201 17 803 | 3/2002 |
| DE | 202 08 670 | 10/2002 |
| JP | 10-260754 | 9/1998 |

OTHER PUBLICATIONS

Pictures of known axial fans provided by the applicant to his Swiss Patent Agent by e-mail on Apr. 8, 2003 fan1.jpg / fan2.jpg / fan3.jpg / fan4.jpg / fan5.jpg.
Drawing of a known radial fan provided by the applicant to his Swiss Patent Agent by e-mail on Apr. 8, 2003: "COOLER ASSY".
Search Report issued on Nov. 3, 2005 for a German utility model that corresponds to the present U.S. application (DE-203 079 81.7, filed May 22, 2003).

* cited by examiner

Primary Examiner—Edward K. Look
Assistant Examiner—Richard A. Edgar
(74) Attorney, Agent, or Firm—Kenyon & Kenyon LLP

(57) ABSTRACT

The axial fan for a computer comprises a rotatable fan blade unit and a motor unit. The fan blade unit comprises a fan head and a plurality of fan blades arranged radially thereto. The motor unit is held by supports passing through the airflow. The supports have a distance of at least 7.5 mm from the fan blades measured in axial direction. Due to this distance being larger in comparison to known solutions the fan produces less disturbing noise.

29 Claims, 2 Drawing Sheets

AXIAL FAN FOR COMPUTER

CROSS REFERENCE TO RELATED APPLICATIONS

This application claims the priority of German utility model 203 079 81.7, filed May 22, 2003, the disclosure of which is incorporated herein by reference in its entirety.

BACKGROUND OF THE INVENTION

The invention relates to an axial fan for a computer. It further relates to a cooling apparatus for an integrated circuit, a cooling apparatus for a microprocessor, a power supply unit for a computer and a case for a computer, each comprising such an axial fan.

Axial fans or axial ventilators of this kind are used for cooling computers and computer components. At axial fans primarily an airflow in the direction of the rotation axis of the fan is generated. This in contrast to radial fans at which the air is drawn in axially, but is then accelerated primarily in radial direction, partially using centrifugal forces and is, depending on the specific embodiment, blown off directly or redirected. There are different places of installation for axial fans in computers. For cooling of single components the fan is for example arranged directly above the specific component. Usually the cooling of components is done using a heatsink. This is attached to the component. The fan causes indirectly, across the heatsink, with its airflow a cooling of the component. At computers typically the CPU, i.e. the central processor, is cooled in this way. A further typical place of installation is the wall of the case of computers. In this kind of arrangement, axial fans are mostly used such that they draw in hot air from the inside of the case and blow it off to the outside. Thereby, colder ambient air flows through chinks and openings to the inside of the case. However, it is also possible, in a reverse manner, to use an axial fan such that it draws in ambient air and blows it into the inside of the case. A very widely used variant of cooling of computers is to arrange a fan such that warm air is drawn from the inside of the case through the power supply unit and blown off to the outside. An important feature of axial fans designed for the field of application "computer" are precisely defined maximum outer dimensions or installation dimensions, which are adjusted to the standards and specifications of the particular cases, power supply units, boards and/or processors.

The known axial fans for computers are usually loud and often cause especially disturbing noises, in particular a buzzing noise at rotational frequencies above 2000 rotations per minute. A known measure for reduction of these noises is a thermo-regulation of the rotational frequency of the fan. This is, however, only effective if the temperature of the device actually allows a reduction of the effect of the fan. A further known measure is the installation of multiple fans. These can then be operated, at an overall equal ventilation effect, each with a lower rotational frequency than a single fan, which altogether results in lower noise emissions. These known measures are, however, because of the additionally needed components, mostly expensive and also imperfect concerning their effectiveness. Further developments are based on designing the fan blades in a special way which, however, led only to moderate improvement results.

BRIEF SUMMARY OF THE INVENTION

Hence, it is a general object of the invention to provide an axial fan of the kind mentioned at the outset with a lower and/or less disturbing noise emission.

Now, in order to implement these and still further objects of the invention, which will become more readily apparent as the description proceeds, the axial fan according to the invention comprises a motor unit, a rotatable fan blade unit driven by said motor unit, said fan blade unit comprising a fan head and a plurality of fan blades arranged radially to said fan head, supports for holding said motor unit, said supports extending through an airflow generated by said fan blade unit, wherein the supports have a distance d of at least 7.5 mm from the fan blades measured in an axial direction.

In another aspect of the invention the axial fan for a computer comprises a static frame, a motor unit, a fan head driven by said motor unit for rotation about an axis of rotation, fan blades attached radially to said fan head and being rotated by said fan head for generating an airflow, and supports connecting said static frame to said motor unit, said supports extending through said airflow, wherein the supports have a distance d of at least 7.5 mm from the fan blades measured parallel to said axis of rotation.

In the conventional axial fans discussed herein, the distance between the supports and the fan blades is mostly only 2 to 3 mm. The invention is based on the insight that the disturbing buzzing noise of the conventional axial fans is caused by turbulence effects in the areas, in which the fan blades pass closely along the supports for the motor unit. This insight can be confirmed by the fact that the disturbing buzzing noise does not occur at radial fans. At these there are, in contrast to the axial fans, because of the geometry, no supports in the air flow necessary. By an enlargement of the distance between the supports and the fan blades the turbulence effects described above and the buzzing noise which comes with it are avoided or at least reduced. Thereby, the invention is going in a direction opposite to the general trend of development in the field of computers to design all units as small as possible. However, retrospectively looking at it, the advantage of the noise reduction outweighs the disadvantage of the slightly larger dimensions of the fan. In certain cases the larger dimensions are not even a disadvantage, because the space additionally taken must be kept free for the incoming flow at the known solutions anyway, as described further down below referring to FIGS. 3 and 4.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
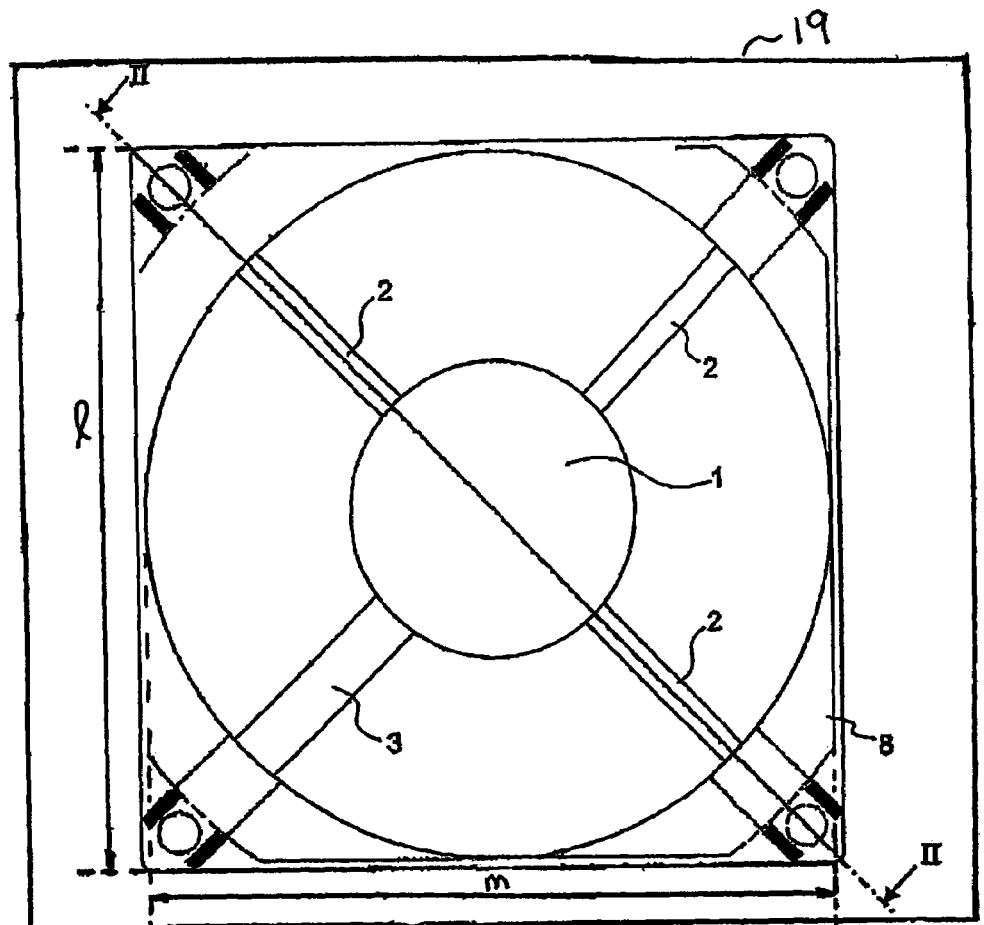
FIG. 1 is a schematic view of a preferred embodiment of the axial fan according to the invention with supports arranged in the outgoing flow.

FIG. 1 shows schematically a preferred embodiment of the axial fan according to the invention. The supports or bridges 2, 3 are arranged in this embodiment in the outgoing flow. In this, the motor unit 1 is connected to the case 8 by two to five bridges 2, 3. The bridges 2 have preferably a round profile. The bridge 3 is designed for receiving the motor wire and has for this a U-shaped profile. In the corners, the case 8 has holes 12 for attachment screws. The case 8 is, when viewed in axial direction, substantial quadratic.

Figure 2:
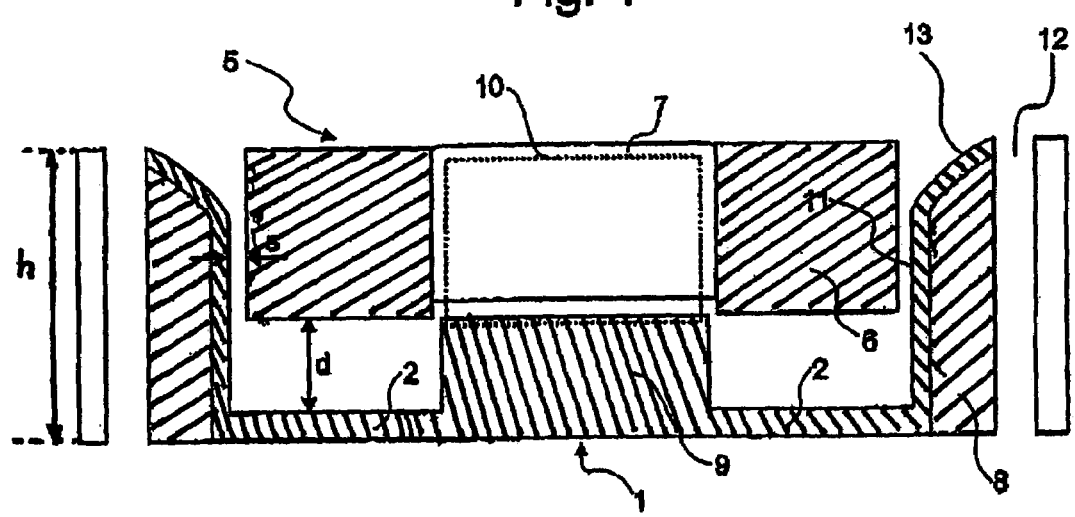
FIG. 2 is a section along line II—II of the axial fan of FIG. 1.

FIG. 2 shows the axial fan of FIG. 1 schematically in a section along line II—II. In the section the "resting" construction of the fan can be seen. The motor unit 1 is connected by bridges 2 with the case 8. In this, the bridges 2 extend through the airflow. The motor unit 1 consists substantially of a socket 9 and the motor 10. The motor 10 causes a rotation of the fan blade unit 5. The fan blade unit 5 comprises a fan head 7 and arranged radially to it five to ten fan blades 6. The motor 10 is arranged substantially inside of the fan head 7. The air flow is during the operation of the fan, at a spatial arrangement of the fan according to the illustration, downwards. The bridges 2 are in the outgoing flow. The fan is, regarding the maximum power output of the motor 10 and the size and number of the fan blades 6, designed for a maximum rotational frequency in the range of 1000 to 4000 rotations per minute. This range has proven to be a good compromise between noise reduction and higher ventilation power. In order that the desired effect of a noise level being lower in comparison to known solutions occurs, the distance d between the bridges 2 and the fan blades 6 measured in axial direction should be at least 7.5 mm. The distance d is preferably about 10 mm.

In this document, the expression "distance measured in axial direction" or "distance measured in radial direction" describes in each case how the distance is to be measured, namely in axial or radial direction, this independent of whether the distance measured in an other direction would be shorter. In this, the terms "axial" and "radial" are to be understood with regard to the rotation axis of the fan blade unit: "axial" means parallel to the rotation axis of the fan blade unitand "radial" means vertical to the rotation axis of the fan blade unit.

The distance d being larger in comparison to known solutions causes a reduction of the noise generated by the fan. The fan blade unit 5 is arranged in a cylindrical opening in the case. The fan blade unit 5 is surrounded by a duct having a cylindrical inner surface 11. On the side of the incoming flow a taper 13 of the cylindrical inner surface 11 is provided. At the shown embodiment, the case has a side length l of about 80 mm. The cylindrical opening in the case has a diameter of about 76 mm. The fan blade unit 5 has a distance s in the range of 1 to 2 mm from the cylindrical inner surface 11 and therewith a diameter of about 73 mm. The installation height h of the shown fan is about 32 mm. Due to the intended use for computers the fans according to the invention have a height h of maximal 45 mm, preferably less than 35 mm. Larger or higher fans are mostly not suited for the installation in commonly used computers. The fans according to the invention have preferably a side length l in the range of 70 to 120 mm, wherein this dimensioning is especially suited for the installation in computers. The diameter m of the fan blade unit is, in each case, mostly about 7 mm smaller than the side length of the case 8, and is therewith preferably in a range of 63 mm to 113 mm.

Figure 3:
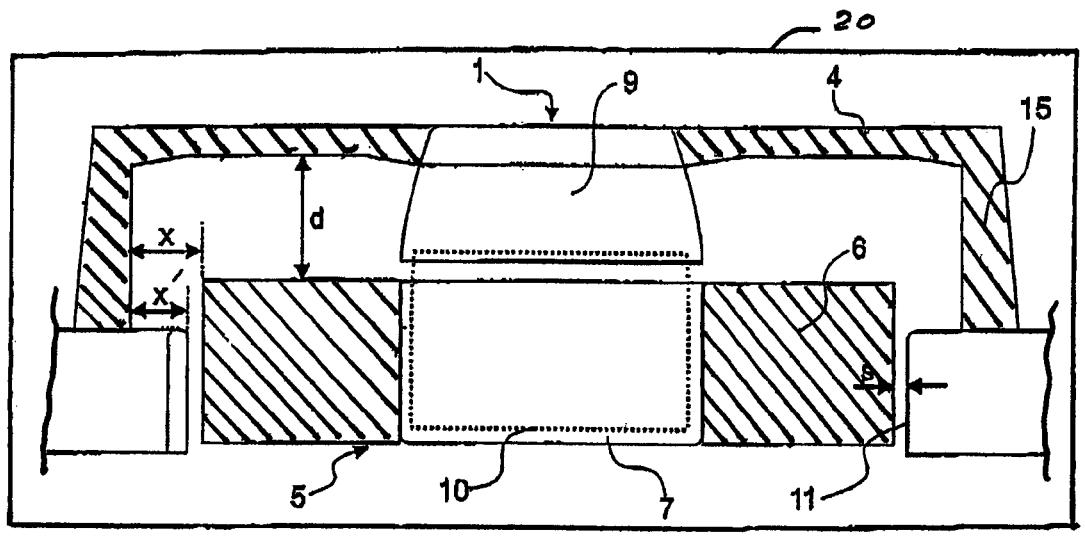
FIG. 3 is a schematic, sectional view a further preferred embodiment of the axial fan according to the invention with supports arranged in the incoming flow.

FIG. 3 shows the axial fan according to the invention in an embodiment with bridges 4 arranged in the in-coming flow schematically in a section. The motor unit 1 and the fan blade unit 5 are "reversed-hanging". The motor unit 1 consist substantially of a socket 9 and the motor 10. The socket 9 has, in a direction parallel to the axis of rotation, a first end and a second end, wherein the motor 10 extends beyond said second end. Said first end is connected to the bridges 4. The bridges 4 are substantially flush with said first end. The fan blade unit 5 comprises a fan head 7 and fan blades 6. The fan blades 6 are surrounded by a duct having a cylindrical inner surface 11. The bridges 4 are supported by columns 15. The bridges 4 are arranged in a distance d from the fan blades 6 measured in axial direction. In order that the desired effect of a noise level being lower in comparison to known solutions occurs the distance d between the bridges 4 and the fan blades 6 should be at least 8.5 mm. Preferably, it is about 13 mm. At bridges in the incoming flow preferably a slightly larger diameter d is used than at bridges in the outgoing flow, i.e. at least about 8.5 mm instead of the limit of 7.5 mm described referring to FIG. 2. This is because at bridges in the incoming flow the occurrence of turbulence and additional noises is more likely than at bridges in the outgoing flow. A further noise reduction compared to known solutions is obtained by not only increasing the distance between the supports and the fan blades measured in axial direction, but also the distance measured in radial direction. For this, the columns 15 are arranged in a distance x from the fan blades 6 measured in radial direction. The distance x is at least 3.5 mm. Preferably the distance x is about 7.5 mm. In this, the distance s of the cylindrical inner surface 11 from the fan blades 6 is preferably not increased and is preferably in a range from 1 to 2 mm. Therefore, according to the invention, the columns 15 are arranged in respect to the cylindrical inner surface 11 shifted a bit outward. The distance x' between the columns 15 and the cylindrical inner surface 11 is at least 2 mm. Preferably it is 6 mm. The distances d and x or x' being bigger in comparison to known solutions causes a reduction of the noise created by the fan. The bigger distance x or x' results in a noise reduction, particularly because the fan blade unit 5 does not cause a purely axial air flow, but a helical air flow. This does not cause any special noises when gliding along the cylindrical inner surface 11. The columns 15, however, are in the way of the helical air flow, which can result in noises. These noises are reduced by a shifting backwards of the columns 15 relatively to the fan blades 6 or relatively to the cylindrical inner surface 11.

Figure 4:
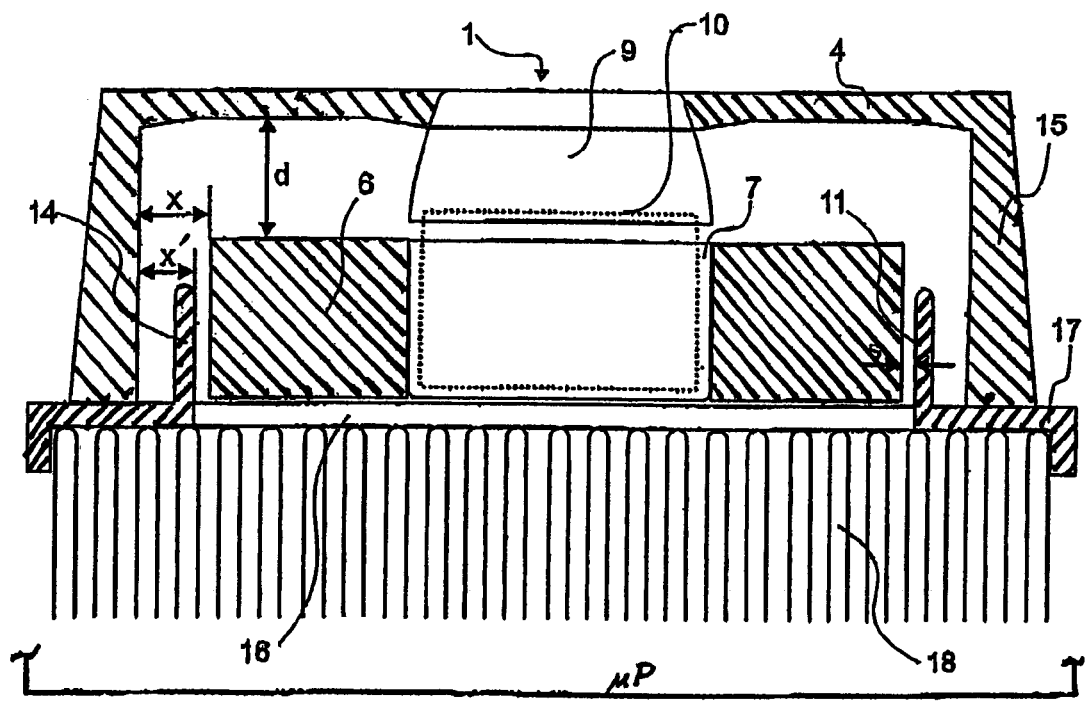
FIG. 4 is a schematic, sectional view of a further preferred embodiment of the axial fan according to the invention in a combination with a cooling element.

FIG. 4 shows a preferred embodiment of the axial fan according to the invention with a heatsink 18, for example for cooling of a semiconductor element μP, schematically in a section. The heatsink 18 is shown only partially. The heatsink 18 is substantially made from aluminum and comprises, for a better heat conduction, copper in the area of contact with the component to be cooled. The distance between the heatsink fins and the fan blades 6 can, as shown, be smaller than the distance d between the bridges 4 and the fan blades 6. It showed that a heatsink 18 arranged close to the fan blades 6 generates, in most cases, less disturbing noises than bridges 4 arranged close to the fan blades 6. The support plate 17 constitutes a static frame. In the support plate 17, an opening 16 is provided for the airflow. The cylindrical inner surface 11 is formed by the support plate 17 and the cylindrical edge 14. The columns 15 are formed separate from the cylindrical edge 14 and directly connected to the support plate 17. However, the columns 15 can also be attached to radial extensions or prolongations of the edge 14 which are especially provided for this purpose. An attachment directly on the edge and in particular a design in one piece together with it simplifies the manufacturing, but is regarding the noise reduction, as already explained above, imperfect. The axial fan with a cooling body is particularly suited for cooling of a microprocessor µP or CPU with a high heat emission, i.e. in the region of 50 to 100 W, as for example an Intel® Pentium® 4 Processor with 3.06 GHz.

In the embodiment of FIGS. 3 and 4 the motor unit 1 and the fan blades 6 are "reversed-hanging". The distance d being larger according to the invention results here in a larger installation height as well, like in the embodiment according to FIGS. 1 and 2. However, at the "reversed-hanging" variant this does not imply a disadvantage, because the space additionally taken has to be held free anyway at the variants without the distance d according to the invention, since the air is substantially drawn in axially. Above the cylindrical edge 14 there must be at least a free space of 50 mm measured in axial direction in order not to impair the cooling power. I.e., the installation height which is not given by the components but by the requirements of the air-flow remains substantially about the same compared to the variants without the distance d according to the invention.

The height of the cylindrical inner surface is at the embodiments of FIGS. 3 and 4 preferably about one-half to two-thirds of the height of the fan blade unit 5. The height can, however, also be designed higher or lower, such that in the case of the embodiment of FIG. 4 a cylindrical edge 14 is omitted completely or partially. A lower height has the advantage that more air can be drawn in radially. Thereby, only a small free space is necessary above the fan for the incoming flow of air. The effective installation height can thereby be reduced.

In the embodiments of FIGS. 3 and 4 the motor unit 1 is held by columns 15 and bridges 4. However, the fan can also be designed such that no clear division between columns and bridges can be recognized, for example at an attachment by curved supports. At such an embodiment the distances from the fan blades described above for bridges and columns have to be maintained accordingly, wherein the substantially axial section of the support is to be regarded as "column" and the substantially radial section of the support as "bridge". The desired noise reduction is obtained by the distances being larger in comparison to known solutions.

At the embodiments of FIGS. 3 and 4 it is not mandatory that the columns are axial and the bridges are radial. The columns can for example also be inclined, for example be inclined in tangential direction. The columns are preferably arranged in a cylinder surface which is coaxial to the rotation axis of the fan blade unit. The bridges can also be angular, for example tangential to the motor unit 1. The bridges are preferably arranged in a plane which is parallel to the rotation plane of the fan blade unit.

The term "support" denotes in the present document generally a connection between motor unit 1 and case 8 or support plate 17. The supports can be designed as bridges, as a combination of bridges and columns or in another way.

The number of supports is in the embodiments above four in each case. Preferably three or four supports are provided. However, embodiments with other numbers of supports are also possible, thus for example one, two, five or more supports. Supports can principally also be a combination of several supports and/or grid structure.

The motor unit 1 is not necessarily a separate component. If for example the motor 10, as shown referring to the figures, is arranged within the fan head 7, it is possible to design the motor 10 or parts of the motor 10 integrated in the fan head. At the embodiments described referring to the figures the motor unit 1 comprises in each case a socket 9. The actual motor 10 is shorter than the motor unit and substantially completely arranged in the fan head 7. However, it is also possible to arrange the motor completely within the socket or within the socket and within the fan head. Furthermore, when dimensioning the engine in a suitable way, the socket can be omitted completely, such that the motor unit consists substantially only of the motor.

The fan according to the invention can, particularly in connection with a heatsink, be used for cooling the CPU of a computer. Furthermore, it can be built into the wall of a computer case 19. In addition, it can be used for the cooling of a power supply unit 20 of a computer, wherein, as already described in the introduction, air from the inside of the computer case is drawn through the power supply and blown off to the outside. For cooling of CPUs the "reversed-hanging" variant according to FIGS. 3 and 4 is especially suited. The "resting" variant according to FIGS. 1 and 2 is especially suited for building it into the wall of a computer case. The fan can be mounted and operated in an arbitrary spatial orientation, i.e. for example horizontal with the outgoing flow directed downwards or vertical with the outgoing flow directed sideways.

While there are shown and described presently preferred embodiments of the invention, it is to be distinctly understood that the invention is not limited thereto but may be otherwise variously embodied and practiced within the scope of the following claims.

The invention claimed is:

1. An axial fan for a computer, comprising:
   a motor unit,
   a rotatable fan blade unit driven by said motor unit, said fan blade unit having a diameter in a range of 63 to 113 mm, said fan blade unit comprising a fan head and a plurality of fan blades arranged radially to said fan head,
   supports for holding said motor unit, said supports extending through an airflow generated by said fan blade unit,
   wherein the supports have a distance d of at least 7.5 mm from the fan blades measured in an axial direction.

2. The axial fan of claim 1, wherein the supports have a distance x of at least 3.5 mm from the fan blades measured in a radial direction.

3. The axial fan of claim 1, wherein the supports have a distance x of about 7.5 mm from the fan blades measured in a radial direction.

4. The axial fan of claim 1, having a height of less than 45 mm along an axis of rotation of said fan blade unit.

5. The axial fan of claim 1, having a height of less than 35 mm along an axis of rotation of said fan blade unit.

6. The axial fan of claim 1, which is, when viewed in an axial direction, substantially quadratic and has a side length in a range of 70 mm to 120 mm.

7. The axial fan of claim 1, wherein it is designed for a maximum rotational frequency in a range of 1000 to 4000 revolutions per minute.

8. The axial fan of claim 1, wherein the supports extend through an outgoing flow and the supports have a distance d of at least 7.5 mm from the fan blades measured in said axial direction.

9. The axial fan of claim 1, wherein the supports extend through an outgoing flow and the supports have a distance d of about 10 mm from the fan blades measured in said axial direction.

10. The axial fan of claim 1, wherein the supports extend through an incoming flow and the supports have a distance d of at least 8.5 mm from the fan blades measured in said axial direction.

11. The axial fan of claim 10, wherein each support comprises a bridge and a column.

12. The axial fan of claim 11, wherein the bridges are arranged substantially in a plane parallel to a rotation plane of the fan blade unit and the columns lie substantially in a cylindrical surface and are at equal distances from an axis of rotation of said fan blade unit.

13. The axial fan of claim 12, wherein the bridges are substantially oriented radially to said axis of rotation.

14. The axial fan of claim 12, wherein the columns are substantially oriented parallel to said axis of rotation.

15. The axial fan of claim 1, wherein the supports extend through an incoming flow and the supports have a distance d of about 13 mm from the fan blades measured in said axial direction.

16. The axial fan of claim 1, wherein the fan blade unit is surrounded by a duct having a cylindrical inner surface at a distance in a range of 1 to 2 mm from the fan blade unit.

17. The axial fan of claim 16, wherein each support comprises a bridge and a column, wherein the columns are located radially outside said cylindrical inner surface at a distance of at least 2 mm from the cylindrical inner surface measured in a radial direction.

18. The axial fan of claim 16, wherein each support comprises a bridge and a column, wherein the columns are located radially outside said cylindrical inner surface at a distance of about 6 mm from the cylindrical inner surface measured in a radial direction.

19. The axial fan of claim 1, wherein three or four supports are provided.

20. The axial fan of claim 1, wherein at least one of the supports is designed for reception or attachment of a cable.

21. A cooling apparatus for an integrated circuit, which comprises a heatsink attachable to the integrated circuit and the axial fan of claim 1 attached to said heat sink.

22. A cooling apparatus for a microprocessor, which comprises a heatsink attachable to the microprocessor and the axial fan of claim 1 attached to said heat sink.

23. A power supply unit for a computer, which comprises the axial fan of claim 1.

24. A case for a computer which comprises the axial fan of claim 1.

25. The case of claim 24, wherein the axial fan is arranged at an inner surface of the case.

26. An axial fan for a computer, comprising:
a static frame,
a motor unit,
a fan head driven by said motor unit for rotation about an axis of rotation,
fan blades attached radially to said fan head and being rotated by said fan head for generating an airflow, said fan head and said flan blades having a diameter in a range of 63 to 113 mm, and supports connecting said static frame to said motor unit, said supports extending through said airflow, wherein the supports have a distance d of at least 7.5 mm from the fan blades measured parallel to said axis of rotation.

27. The axial fan of claim 26 wherein each support comprises
a column mounted to said frame and being parallel to said axis of rotation and
a bridge extending substantially perpendicular to said axis of rotation and connecting said column to said motor unit.

28. The axial fan of claim 27 wherein said motor unit comprises a motor and a socket, said socket having, in a direction parallel to said axis of rotation, a first and a second end, wherein said first end of said socket is connected to said bridges and wherein said motor extends beyond said second end.

29. The axial fan of claim 28, wherein said bridges are substantially flush with said first end.

* * * * *

UNITED STATES PATENT AND TRADEMARK OFFICE
CERTIFICATE OF CORRECTION

PATENT NO. : 7,101,149 B2  Page 1 of 1
APPLICATION NO. : 10/834232
DATED : September 5, 2006
INVENTOR(S) : Magnus Huber It is certified that error appears in the above-identified patent and that said Letters Patent is hereby corrected as shown below:

| Column | Line | |
|---|---|---|
| 3 | 44 | Change "unitand" to --unit and--. |
| 3 | 53 | Change "length l" to --length $\ell$--. |
| 3 | 62 | Change "length 1" to --length $\ell$--. |

Signed and Sealed this

Twenty-fifth Day of March, 2008

JON W. DUDAS
*Director of the United States Patent and Trademark Office*